(12) United States Patent
Ishihara et al.

(10) Patent No.: US 7,423,349 B2
(45) Date of Patent: Sep. 9, 2008

(54) SEMICONDUCTOR DEVICE

(75) Inventors: Shosaku Ishihara, Chigasaki (JP); Osamu Ikeda, Yokohama (JP); Ryouichi Kajiwara, Hitachi (JP); Shinji Hiramitsu, Kashiwa (JP); Satoshi Matsuyoshi, Takahagi (JP)

(73) Assignee: Hitachi, Ltd., Tokyo (JP)

( * ) Notice: Subject to any disclaimer, the term of this patent is extended or adjusted under 35 U.S.C. 154(b) by 314 days.

(21) Appl. No.: 11/412,090

(22) Filed: Apr. 27, 2006

(65) Prior Publication Data
US 2006/0246304 A1 Nov. 2, 2006

(30) Foreign Application Priority Data
Apr. 28, 2005 (JP) ............... 2005-130740

(51) Int. Cl.
*H01L 23/48* (2006.01)
*H01L 23/52* (2006.01)
*H01L 29/40* (2006.01)
(52) U.S. Cl. ...................... 257/783; 257/782
(58) Field of Classification Search ............. 257/762, 257/772, 783, 782
See application file for complete search history.

(56) References Cited
U.S. PATENT DOCUMENTS
6,300,234 B1* 10/2001 Flynn et al. ............. 438/612
6,656,770 B2* 12/2003 Atwood et al. ............. 438/118
6,933,505 B2* 8/2005 Vuorela ............... 250/370.13
7,038,293 B2* 5/2006 Choi et al. ................ 257/510
2002/0140059 A1 10/2002 Yamazaki et al.
2005/0221634 A1* 10/2005 Hilty et al. .................. 439/70

FOREIGN PATENT DOCUMENTS

| EP | 0 828 341 A2 | 3/1998 |
|---|---|---|
| JP | 07-161877 | 6/1995 |
| JP | 10-125856 | 5/1998 |
| JP | 2002-142424 | 5/2002 |
| JP | 2002-261210 | 9/2002 |
| JP | 2002-359328 | 12/2002 |

OTHER PUBLICATIONS

Journal of Electronic Materials, vol. 31, No. 11, 2002 p. 1244-1249.

* cited by examiner

*Primary Examiner*—S. V Clark
(74) *Attorney, Agent, or Firm*—Antonelli, Terry, Stout & Kraus, LLP

(57) ABSTRACT

The present invention provides a semiconductor device comprising a semiconductor element and a copper member which are bonded to each other by a bismuth-based (Bi-based) bonding material having its melting temperature of not less than 250° C., wherein silver (Ag) is diffused in a region of the bonding material in the vicinity of an interface thereof to the semiconductor element with an inclination of concentration of the silver from the interface, in order to realize a manufacture of the semiconductor device without using lead (Pb) at low cost.

20 Claims, 9 Drawing Sheets

SEMICONDUCTOR DEVICE

The present application claims priority from Japanese application JP2005-130740 filed on Apr. 28, 2005, the content of which is hereby incorporated by reference into this application.

BACKGROUND OF THE INVENTION

1. Field of the Invention

The present invention relates to a bonding member (material) for a semiconductor device, a semiconductor device using the bonding member, and a manufacturing method therefor and, more particularly, to a semiconductor device having high voltage resistance (a high-voltage semiconductor device, hereinafter).

2. Description of the Related Art

At present, for bonding inside a part and high heat-resistive bonding, high-Pb solder having a high melting point (solder containing a high level of lead) is used. In particular, in case of a high-voltage semiconductor device, heat resistant temperature of approximately 200° C. is required in a working environment of the high-voltage semiconductor device, so that the high-Pb solder having a solidus in the vicinity of 300° C., for example, a solder containing a high level of Pb (lead), such as 95Pb5Sn (a solidus line at 300° C. and a liquidus line at 314° C.), 98Pb2Sn (a solidus line at 316° C. and a liquidus line at 322° C.), 98Pb2Ag (a solidus line at 304° C. and a liquidus line 305° C.), 97.5Pb1.5Ag1Sn (a solidus line at 309° C. and a liquidus line 309° C.) or the like is used for bonding a semiconductor element.

As examples of such a high-voltage semiconductor device, there are a power semiconductor element, such as IGBT, diode, GTO, transistor or the like, and-a power semiconductor-module using them (hereinafter referred to as "semiconductor device" generically). These semiconductor devices are described in, for example, the following patent documents 1 to 5. Also, a new solder which is substituted for the above-mentioned high-Pb solder is discussed in the following non-patent document 1.

[Patent Document 1]

Japanese Patent Application Laid-Open No. Hei. 10-125856 (corresponding to EP 0828341 A2).

[Patent Document 2]

Japanese Patent Application Laid-Open No. Hei. 7-161877.

[Patent Document 3]

Japanese Patent Application Laid-Open No. 2002-142424.

[Patent Document 4]

Japanese Patent Application Laid-Open. No. 2002-261210.

[Patent Document 5]

Japanese Patent Application Laid-Open No. 2002-359328 (corresponding to US 2002/0140059 A1).

[Non-Patent Document 1]

John N. Lalena, Nancy F. Dean, and Martin W. Weiser; "Experimental Investigation of Ge-doped Bi-11Ag as a New Pb-Free Solder Alloy for Power Die Attachment", Journal of ELECTRONIC MATERIALS, Vol. 31, No. 11, 2002, pages 1244-1249.

SUMMARY OF THE INVENTION

However, in recent years, a solder which does not contain lead (Pb) is recommended worldwide. Also, there have been demands in the field of electronic equipment towards employment of a semiconductor device using connection material (substitute connection material) which should be substituted for the conventional solder containing Pb and of another connection structure. (or a joint structural material).

While conditions which are required for the connection structure and a bonding material to be used for the connection structure are various, in case of a bonding material to be used for a high-voltage semiconductor device, heat resistant temperature of approximately 200° C. is required in a service environment of the high-voltage semiconductor.

Thus, the object of the present invention is to provide a bonding material for semiconductor devices which is suitable for realizing a connection structure which is produced at low cost and superior in heat-resistance, using a new solder that is substituted for the conventional solder containing Pb, a semiconductor device using the bonding material, and a manufacturing method for manufacturing the semiconductor device.

In order to attain the above-mentioned object, in the present invention, in a semiconductor device in which a semiconductor element and a copper member are bonded to each other, the connection between the semiconductor element and the copper member is made by a bismuth-based (Bi-based) first bonding member (material) having a melting point of 260° C. or more, wherein metal formed on a surface of the semiconductor element is "gradually diffused" (diffused with an inclination of its density or concentration) in a region of the bonding member near an interface thereof connected to the semiconductor element.

Also, in order to attain the above-mentioned object, in the present invention, in a semiconductor device in which a semiconductor element is metallically bonded to a member, the connection between the semiconductor element and the member is made by a first bonding member (material) including either "only bismuth (Bi)" or "bismuth in major proportions thereof and silver (Ag) in 60 weight % or less thereof", wherein the first bonding member includes a diffusion layer of metal formed on a front surface of the semiconductor element in a region of the bonding member near an interface thereof connected to the semiconductor element.

Moreover, in order to attain the above-mentioned object, in the present invention, in a semiconductor device in which one surface of a semiconductor element is bonded to a first member by a first bonding member (material) and the other surface of the semiconductor element is bonded to a second member by a second bonding member (material), the first bonding member and the second bonding member are metals containing bismuth (Bi) or bismuth in major proportions thereof and silver (Ag), and diffusion layers of metal (layers) provided on the surfaces of the semiconductor element are formed in both the first bonding member and the second bonding member in the vicinities of respective interfaces to the semiconductor element.

Moreover, in order to attain the above-mentioned object, in the present invention, in a semiconductor device in which a copper (Cu) member is bonded onto one surface of a semiconductor element on which a metallic film is formed by a first bonding member (material), and a lead electrode is bonded onto another surface of the semiconductor element by a second bonding member (material), the first bonding member and the second bonding member are metals which contain bismuth (Bi) in major proportions thereof and are different in the content of silver (Ag) from each other, and the second bonding member is formed of material having a melting point higher than that of the first bonding member.

In accordance with the present invention, there is provided a high-voltage semiconductor device in which heat-resistance of 250° C. or more is ensured by using new bonding material which is Bi-based, and without using a solder containing Pb.

BRIEF DESCRIPTION OF THE DRAWINGS

FIG. 11 is a schematic view illustrating a sectional structure in which two conductive members which are formed of copper or any alloy containing copper are Ag-plated at both surfaces thereof and bonded to each other by a solder material according to the present invention, FIGS. 12A and 12B are schematic sectional views illustrating connections structures made between two members by using two bonding layers according to the present invention.

DETAILED DESCRIPTION

Heat-resistant temperature which is required in a semiconductor device, in particular, a high-voltage semiconductor device is 200° C., so that a melting point of a material which contributes to connection between members in a material structure of a bonding section is required to be more than 250° C. Moreover, regarding a temperature at the time when bonding of the semiconductor element is carried out by a bonding material, it is necessary to bond the semiconductor element at a temperature of not more than 600° C. from the standpoint of protection of the semiconductor element. Thus, a melting point of a metallic element being a main ingredient of the bonding material is required to range from 250° C. to 600° C.

First of all, as a bonding material meeting such conditions, a bonding material that is substituted for the conventional lead (Pb)-solder will be discussed hereinafter.

As metallic elements meeting the above-mentioned conditions, there are Bi (bismuth, melting point=271.4° C.), Po (polonium, melting point=254° C.), Cd (cadmium, melting point=321.1° C.), Ti (thallium, melting point=302.5° C.), Zn (zinc, meltingpoint=419.6° C.), Te (tellurium, meltingpoint=449.8° C.), At (astatine, melting point=300° C.) and Pb (lead, melting point=327.5° C.). Of these metallic elements, Bi and Zn are suitable as materials meeting workability, safety and economy. Now, when a comparison between Bi and Zn is made, the Vickers Hardness of Bi is 11 Hv or so whereas the Vickers Hardness of Zn is 55 Hv and Zn is hard, so that Bi is an optimum material from the standpoint of stress at the time of bonding. Moreover, as the bonding material, there may-be employed a bonding material in which eutectic element(s) having melting point ranging 250° C. to 600° C. is to be formed, as well as single metallic element. However, when any material which is not single metallic material but is binary-material system is employed, if non uniformity of composition of the solder-connection section is taken into consideration, it is favorable that the bonding material which is supplied to at least the connection section does not contain an ingredient having melting point of not more than 250° C., since in a structure in which the ingredient having melting point of not more than 250° C. remains after the connection is made by using the bonding material, the ingredient is melted, resulting in the reliability of the bonding being decreased.

Therefore, it is preferable that all ingredients of the bonding material to be supplied for bonding have melting points of more than 250° C. Actually, in case of the high-Pb solder discussed above, if it contains Sn, there is a possibility that Sn will be melted at melting point of 232° C. due to the nonuniformity of the composition of the high-Pb solder and the reliability of heat-resistant temperature of 250° C. will not be obtained. Moreover, an eutectic composition material system is transformed into a two-phase mixture below the melting point of the eutectic composition. From the standpoint of decrease of stress of the bonding section, as a composition which occupies more than a half of the entire of the two phases and contributes to the bonding, the composition is not a hard intermetallic compound and is required to be a soft material, e.g., a single metal or a metal material (a solid solution) thereof in which trace amounts of different metal(s) therefrom is solved to form solid solution. As a binary-materials system (e.g., binary alloys) meeting such conditions, there are a Bi—Ag system, a Bi—Au (gold) system, a Bi—Ni (nickel) system, a Bi—Cu system, a Bi—Zn system, a Bi—Al (aluminum) system, a Bi—Mg (magnesium) system, a Bi—Mn (manganese) system, a Bi—Sb (antimony) system, a Bi—Ge (germanium) system, and the like. As metal(s) which accounts for most of each of these systems, material(s) which forms soft Bi is suitable. Of these systems, the Bi—Ag system is suitable from the standpoint of the fact that the Bi—Ag system contains metallic elements which do not form an intermetallic compound with Bi, and from the standpoint of good workability of the Bi—Ag system.

The above-mentioned matters are similar in a materials system of binary or over. As a metal accounting for most of the materials system, Bi is suitable. That is, in the materials system of ternary or over, Bi is also contained as a main element, and a Bi—Ag system, the metallic elements other than Bi in the binary-materials system discussed above or Pd, Pt, Fe and the like may be suitably selected as additive metallic-elements, taking the melting point of the eutectic composition, the intermetallic compound, workability and the like into account.

Figure 10:
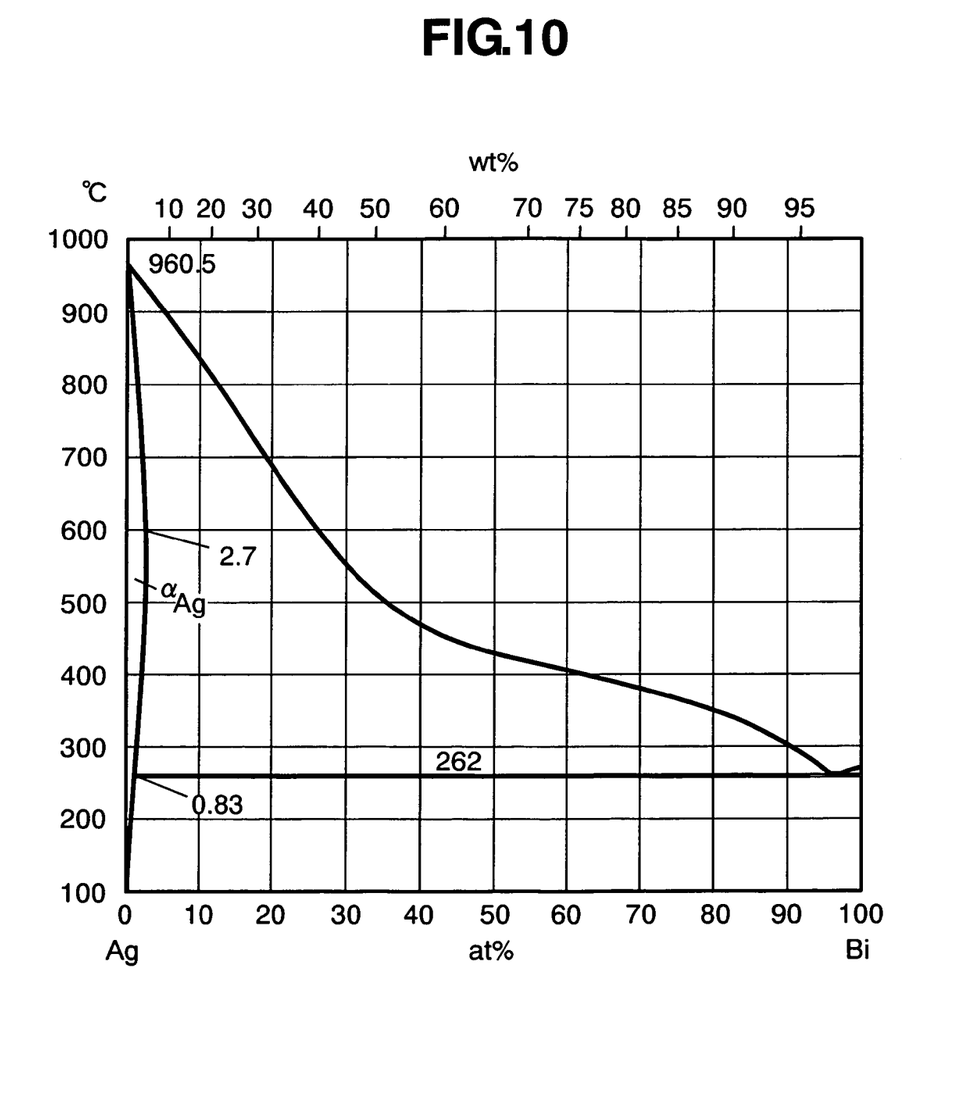
FIG. 10 is a view illustrating a condition of Bi—Ag system solder.

Moreover, as shown in FIG. 10 illustrating a state of a binary system alloy of the Bi—Ag system, the weight percent of Ag should be suitably changed in order to obtain a predetermined melting point. In order to obtain a melting point of not more than 600° C., Ag should be restricted to about 60 weight % or less.

In the non-patent document 1, a Bi solder which contains 11 weight % Ag (silver) (hereinafter referred to as "Bi-11Ag") is disclosed as a new solder material which should be substituted for the high-Pb solder (Pb containing 5 weight % Sn (tin). The non-patent document 1 teaches that, though Bi is inferior in thermal conductance, the addition of Ag to Bi increases mechanical strength, ductility (plasticity) as well as thermal conductance thereof. Moreover, the non-patent document 1 also teaches that a layer of intermetallic compound $NiBi/NiBi_3$ is formed in an interface between this solder material and Ni, and when this brittle intermetallic compound layer is deformed in a bonding structure which is formed by the solder material, the brittle intermetallic compound layer will becomes a start point which brings about cracks of the bonding structure.

In a fine eutectic structure of Bi-11Ag which is shown as an scanning electron microscope image in the non-patent document 1, primary particles of Ag-rich solid solution are present in the form of islands. When Ag content in the solder material of the Bi—Ag system is increased, such solid solution in the solder material is increased, resulting in bonding strength provided by the solder material of the Bi—Ag system being lowered. However, the inventors have found that bonding strength between the members which is provided by the solder material can be increased in such solid solution or an eutectic structure similar thereto by increasing the Ag content to a predetermined range of concentration. That is, when the solder material of the Bi—Ag system contains 15 weight % or more Ag, as shown in FIGS. 11A, 11B, 12A and 12B, an Ag-rich region extends toward a thickness $(t_s)$ direction of a bonding layer formed by the solder material and bonded to both of the members to be bonded to each other by the bonding layer.

Figure 11A:
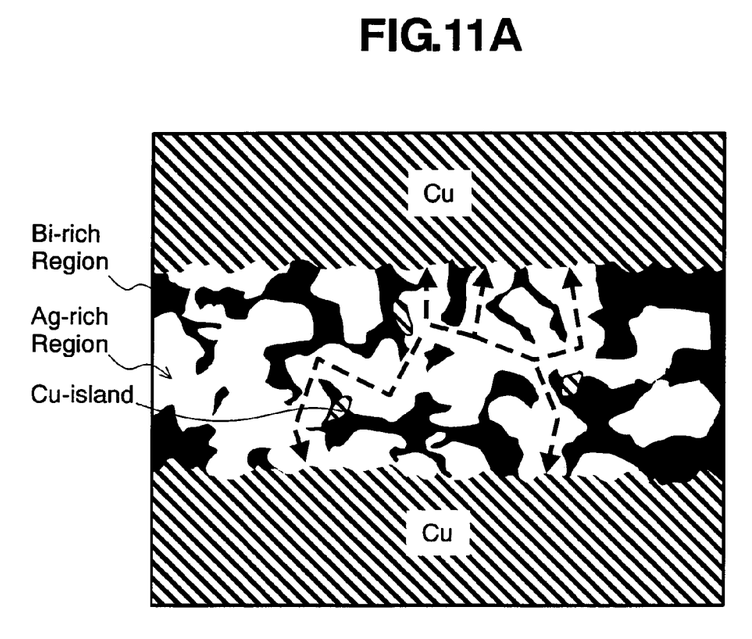
FIG. 11A is a schematic sectional view illustrating the surfaces of the members on which Ag solder layers do not remain after a soldering step.
Figure 11B:
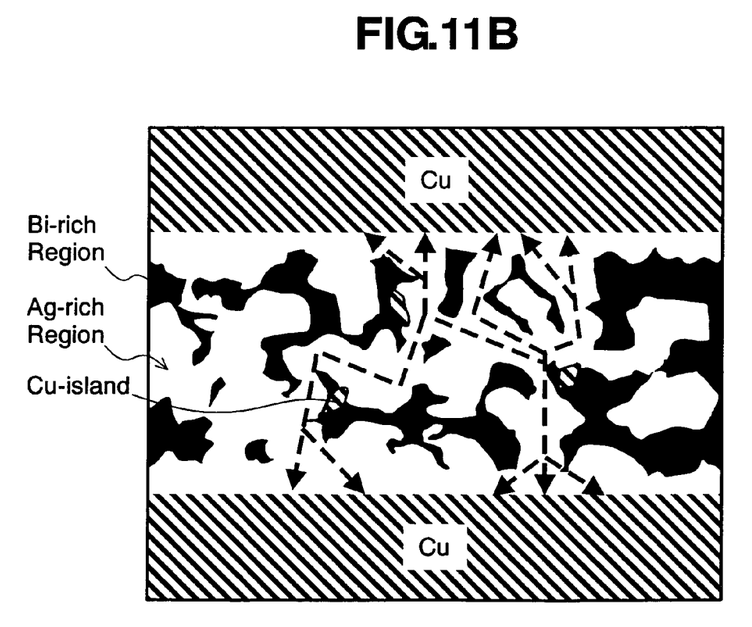
FIG. 11B is a schematic sectional view illustrating the surfaces of the members on which the Ag solder layers remain after the soldering step.

FIGS. 11A and 11B are each a schematic sectional view of a sectional structure in which two members which are formed of copper or an alloy containing copper and front surfaces of which are plated with Ag are bonded to each other by a solder material according to the present invention. More particularly, FIG. 11A is a schematic sectional view illustrating the structure in a case where an Ag plating layer is diffused in a bonding layer at a soldering step (the Ag plating does not remain on the surfaces of the members). FIG. 11B is a schematic sectional view illustrating the structure in a case where the Ag plating layer remains on the surfaces of the members after the soldering step. In either of the structures shown in FIGS. 11A and 11B, a first region of a Bi—Ag system alloy in which Ag content is lower than Bi, content (Bi-rich region, in gray) and a second region of a Bi—Ag system alloy in which Ag content is higher as compared with the first Bi—Ag system alloy region (Ag-rich region, in white) are present in the bonding-layer. However, the Ag content in the latter may be lower than the Bi content. Moreover, when three or more types of alloy regions which are different from one another in composition rate thereof with respect to Bi and Ag are produced according to a melting condition of the solder material, at least one of alloy regions which are alloy regions other than an alloy region in which Ag content is lowest may be bonded to the two members as mentioned above. Furthermore, the higher Ag content (weight %) in an alloy region which is bonded to both of the two members described above, the higher the bonding strength between the members, and the higher Ag content in the alloy region as compared with Bi content, the higher the bonding strength.

However, the inventors have found abuse in a case where the above region in which Ag content is high and which extends between the two members to be bonded is formed on an entire region of the bonding layer. That is, the increase in Ag content in the solder material of a Bi—Ag system reduces flexibility of the solder material as well as brittleness due to containing of Bi. Therefore, when the two members to be bonded to each other by the solder material are different from each other in thermal expansion coefficients thereof, there is no denying a possibility that the bonding layer will be crushed by stress generated due to difference between the thermal expansion coefficients. For example, when a semiconductor element in which a thermal expansion coefficient of Si (silicon) is predominantly exhibited, and an electrode member or a mounting member in which a thermal expansion coefficient of metal such as Cu or the like is predominantly exhibited, are bonded to each other by a solder material of a Bi—Ag system in which Ag content is high, the bonding of them by the solder material becomes increasingly broken according to a change in atmosphere temperature. In view of this situation, the inventors caused the Ag-rich region, which contacted the two members interposing the bonding layer therebetween, to be locally formed in the bonding layer, to thereby prevent the breakage of the bonding layer. In other words, a plurality of regions (Ag-rich regions) which contact the two members interposing the bonding layer therebetween are provided and Bi-rich regions (Ag-poor regions) are provided between adjacent Ag-rich regions. In a preferred example, an entire surface of at least one of the two members interposing the bonding layer therebetween, which is contacted with the bonding layer is not covered with the Ag-rich region (region extending between the two members) and is partially contacted with the Bi-rich region (region having Ag composition rate poorer than the region extending between the two members) When either surfaces of the two members which are contacted with the bonding layer are planted with Ag, this planting layer may be regarded as a surface of each of the members.

Function of the above-mentioned bonding layer of the present invention will be discussed hereinafter with reference to FIGS. 11A and 11B. The Ag-rich region is partially flexed but extends along a thickness direction of the bonding layer and is contacted with both of the two members (indicated in FIGS. 11A and 11b by reference character Cu). Thus, a plurality of bonding structures are formed between a main surface of one of the members and a main surface of the other of the members as indicated in FIGS. 11A and 11b by arrows and chain-lines. Each of the bonding structures causes the two members to be bonded to each other and provide a good electrical connection between the members. In the bonding layer, the Bi-rich regions are present so as to causes the bonding structures to be spaced apart from one another, and serve as springs to buffer stress produced due to the above-mentioned difference in thermal expansion coefficients between the members. Also, the Bi-rich regions provide electrical continuity between the two members.

Figure 12A:
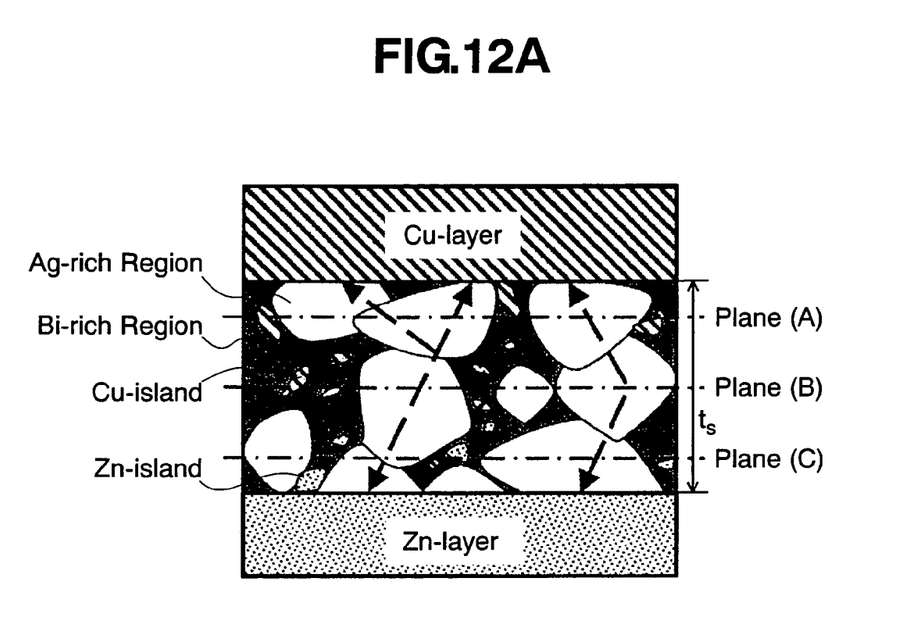
FIG. 12A is a schematic sectional view illustrating a sectional structure in which a Cu-layer is formed on one of the members and a Zn-layer is formed on the other of the members.
Figure 12B:
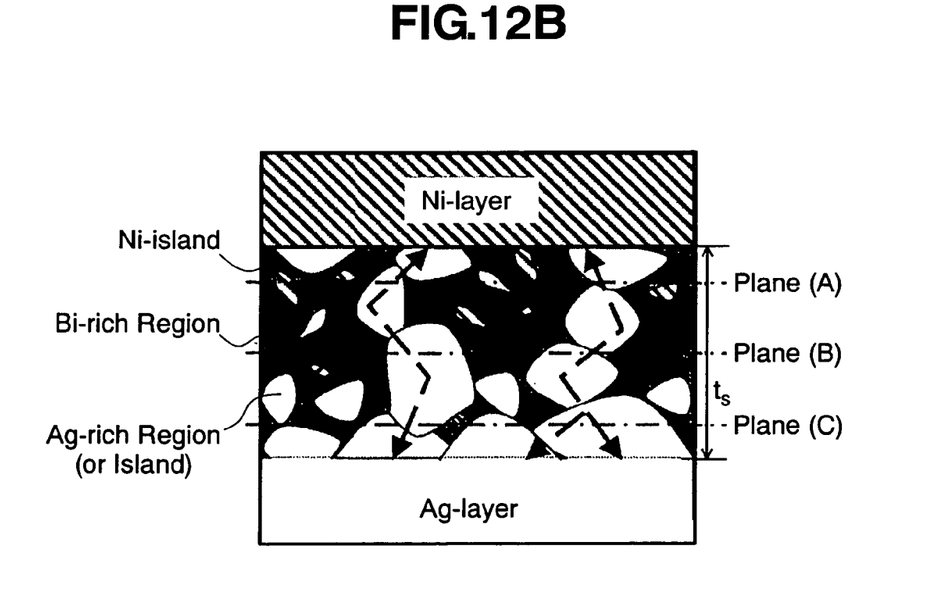
FIG. 12B is a schematic sectional view illustrating a sectional structure in which an Ni-layer is formed on the one of the members and an Ag-layer is formed on the other of the members.

Incidentally, FIG. 12A illustrates a sectional structure in which a member having a Cu-layer formed thereon and a member having a Zn-layer formed thereon are bonded to each other through the bonding layer according to the present invention. FIG. 12B illustrates a sectional structure in which a member having an Ni-layer formed thereon and a member having an Ag-layer formed thereon are bonded to each other through the bonding layer according to the present invention. In these sectional structures, Ag-rich regions also form a plurality of bonding structures between the members as indicated in FIGS. 12A and 12B by arrows and chain-lines, and Bi-rich regions which are formed among the bonding structures buffer stress which is applied to the bonding layer. The bonding layer has a thickness ($t_s$) of, for example, a range between 1 mm-0.3 mm. Also, in FIGS. 12A and 12B, the Cu-layer, Zn-layer, Ni-layer and Ag-layer are thickly-illustrated. However, when they are formed on surfaces of the members as planting layers, thicknesses of the layers after bonding (soldering) are preferably limited to a thickness of less than five-hundredth ($0.05\ t_s$) of a thickness of the bonding layer and better yet to not more than one-hundredth ($0.01\ t_s$) of the thickness of the bonding layer.

In order to realize the shape and function of this bonding layer, it is experimentally found that it was necessary to cause at lest 15 weight % or more Ag to be contained in the alloy of a Bi—Ag system (solder) forming the bonding layer. In the solder of the Bi—Ag system containing 11 weight % Ag which is taught by the non-patent document 1, neither the above-mentioned structure nor function is realized. A so-called power module manufactured as an experiment using this solder was detached from an electrode of a semiconductor element. The Ag content in the alloy of a Bi—Ag system which forms the above-mentioned bonding layer in the semiconductor device according to the present invention is preferably limited to 60 weight % or less, taking the manufacturing method therefor into account. Moreover, when the semiconductor device is to be used in a harsh temperature-variation environment (in particular, a condition where the semiconductor is subjected to high temperature by higher current-continuity of the semiconductor device or when the semiconductor device is carried by a box member of an internal combustion engine), Ag content in the alloy of the Bi—Ag system is set to 20 weight % or more, whereby electrical continuity between the members can be obtained. It is preferable that the effect of temperature-variation on the semiconductor device is reduced by setting Ag content to 40 weight % or less.

As discussed above, it is desirable that material of a Bi—Ag system, Ag content of which is within a predetermined level is used as a bonding material for members to be bonded at heat resistant temperature of 250° C.-600° C. A preferred composition of this Bi—Ag system material may not be filled with solder material to be used for the bonding and may be present as a composition of the above-mentioned layer which is filled with this solder and atoms diffused from the metallic layers (planting layers) which are formed on at least one bonding surfaces of the pair of the members to be, bonded to each other by the solder. Moreover, the bonding material of a Bi—Ag system may contain a trace of inclusions to the extent that they have little adverse effect on the bonding property of the bonding material.

Now, bonding of the above-mentioned members and a semiconductor element or another member will be discussed hereinafter.

Bi reacts with various metallic elements as described above but does not substantially react with Si which is material for a semiconductor element, so that Si and Bi can not be directly bonded to each other. Therefore, for example, a metallic layer which is superior in wettability with respect to Bi is formed on an Si surface, whereby the wettability of Bi can be provided at the time of bonding and, as a result, good bonding between Si and Bi can be provided. Au, Ag, CuNi and the like are suitable as metallic elements which are superior in wettability with respect to Bi. Moreover, the reaction between these good wettable metallic elements and melted Bi is brought about in such a manner that they are dissolved in amount shown in the condition figure, for a short time. For example, when metallization is carried out with Ni, Ni is easy to dissolve into Bi and vanish in a layer which is formed by general plating and has a thickness of 5 µm, at 380° C. for three minutes, so that a barrier layer of, for example, Ti, Cr or the like is formed as an underlying layer and maybe connected to Bi. Incidentally, the upper metallization layer on the barrier layer may be formed of Ni or Ag as described above or may be formed by forming Au on a Ni surface. In either case, it is preferable that a thickness of the layer is set to 2 µm or less which allows Ni to easily dissolve into Bi.

In this bonding, one or more metallic elements forming the metallization formed on the barrier layers on the surfaces of the members to be bonded are gradually diffused with an inclination of its density or concentration in a region of the bonding member (bonding layer) near an interface thereof connected to the barrier layers of the bonded members, and the members are bonded under conditions where intermetallic compounds are not formed. In FIG. 12A, a state where Cu (or Cu alloy) and Zn (or Zn layer) are gradually-diffused with respect to the bonding layer is shown. In FIG. 12B, a state where Ni (or Ni alloy) and Ag (or Ag alloy) are gradually-diffused with respect to the bonding layer is shown.

When the bonding is carried out under conditions that the metallization dissolving in an upper region of the barrier layer is thick or a speed of dissolving into Bi is low, the metallization in the upper region of the barrier layer remains and forms an intermetallic compound with Bi in a vicinity of a bonding interface. Generally, the intermetallic compound will lower bonding reliability. For example, when the metallization is Ni, BiNi or $Bi_3Ni$ is formed. These are brittle, so that the bonding reliability will be considerably lowered by producing of cracks due to thermal stress or the like. On the other hand, Ag and Cu do not form an intermetallic compound with Bi, so that even if the metallization remains, the bonding reliability will not be lowered.

On the other hand, regarding the members to be bonded which are formed of any metallic elements other than Si, it is also preferable that surfaces of the members to be bonded are formed of Au, Ag, Cu, Ni or the like in order to obtain wettability with respect to the bonding material. As a bonding structure between the bonding material and the members to be bonded, there may be employed a bonding structure in which like the members to be bonded which are formed of Si, the surfaces (bonding surfaces) have barrier layers formed of Ti Cr or the like thereon. However, even if such barrier layers are not formed, there is no possibility that this will interfere with.

When the barrier layers are formed, there is produced a bonding structure in which the metallization in upper regions of the barrier layers is dissolved and diffused in Bi and the metallic elements of the metallization in the upper regions of the barrier layers are gradually diffused into the bonding member. When the barrier layers are not formed, an outermost surface metallization is dissolved and diffused in Bi and Bi reacts with a lower metallization thereof or the metal of the members to be bonded, so that the lower metallization or the metal of the members to be bonded may be metallic elements which react with Bi as described above.

When the barrier layer is not formed, and the metallization of the members to be bonded and the metals of the members to be bonded remain and form an intermetallic compound with Bi, there is produced a bonding structure in which the outermost surface metallization and the lower layer metallization or the metallic elements of the members to be bonded are gradually diffused in the bonding member. As material that facilitates good bonding with bismuth (Bi) without forming an intermetallic compound in the same manner as discussed above, Cu, Ag and the like are suitable. For example, when a copper member is employed, even if the metallization on a surface of the copper member vanishes, good bonding between Cu of the copper member and Bi can be obtained. In case of a copper member, even if a surface thereof is not metallized, good bonding can be obtained.

When Ag content in the Bi—Ag system material forming the bonding layer is more than 15 weight %, the gradual-diffusion described above reaches ½ of a thickness of the bonding layer as shown in FIGS. 12A and 12B (shown as "Plane B" in these Figures). In other words, even if an Ni-layer is formed on a surface of a member to be bonded, an intermetallic compound produced by reaction of the layer and Bi does not aggregate in the surface of the member to be bonded, and is dispersed in the form of islands, as described in the non-patent document 1. It is presumed that this is caused by facilitating the precipitation of Ag-rich island in the bonding layer because of the composition of the Bi—Ag system material. When the concentration of Cu in the bonding layer shown in FIG. 12A and the concentration of Ni in the bonding layer shown in FIG. 12B are analyzed in a thickness direction thereof by a secondary ion mass spectrometer, detection strength thereof is gradually reduced as a depth from a main surface becomes deep from a surface of 0.2 $t_s$ (Plane A) and a surface of 0.2 $t_s$ (Plane B) to a surface of 0.8 $t_s$ (Plane C) The gradual-diffusion (inclined distribution) of the metal elements(s) in the bonding layer of the semiconductor device according to the present invention can also be evaluated so.

On the other hand, Si of the semiconductor element and Cu of the member are considerably different from each other in thermal expansion coefficients thereof as the thermal expansion of Si is $2.6 \times 10^{-6}/°C$., whereas that of Cu is $17 \times 10^{-6}/°C$. and higher. Therefore, when the semiconductor element is bonded directly to a thick Cu-member, stress is produced due to a difference in the thermal expansion coefficients. When the stress is larger than a strength of Si of the semiconductor element, cracks will be produced in Si. In order to reduce such a thermal stress, a stress relaxation member indicating its thermal expansion coefficient between those of Si and Cu which eases stress between the semiconductor element and the Cu member may be interposed between the semiconductor element and the Cu member and bonded to them. As the stress relaxation member, there may be employed a stress relaxation member which has a three-layer structure in which an invar of a low thermal expansion coefficient material or 42 alloy is interposed between Cu, and an entire thermal expansion coefficient can be controlled by changing a thickness ratio between the low thermal expansion coefficient material and Cu. Such a material buffering thermal expansion coefficient difference has Cu on front and back surfaces thereof, so that it can be easily bonded to Bi. Moreover, in order to provide wettability, the front and back surfaces of the material buffering thermal expansion coefficient difference may be plated with Ni, Au, and Ag. Also, the stress relaxation member is not limited to a member having one layer constructed as discussed above and may be a member suitably having a plurality of the layers.

As requirements for bonding carried out using a bonding member of a Bi-system, neutral or reducing atmosphere is suitable. Preferably, reducing atmosphere in which hydrogen is added to nitrogen is suitable. Also, when flux is used for improvement in wettability, flux that is perfectly scattered during bonding in such a manner that carbides or the like do not causes the bonding strength to be lowered may be used. Moreover, when an oxide integument of the bonding material is firm and hard to get a wetting even in reducing atmosphere, connection should be made using flux or should be made while pressing so as to cause the oxide integument to be mechanically broken or removing the oxide integument by a scrubber or the like. Furthermore, in order to reduce voids or the like in the bonding material, it is effective to carry out depressurization or provide vacuum at melting temperature region of the bonding material. As characteristics of Bi after melted and cooled, its yield stress is about 25 MPa or so and its specific resistance is $1.07 \times 10^{-6}$ Ωcm. These are approximately equivalent to the yield stress 30 MPa of Pb and the specific resistance $2.08 \times 10^{-6}$ Ωcm of Pb, so that bonding material of a Bi-system can be easily substituted for a bonding region in which high-Pb solder is used. Incidentally, thermal conductivity of Bi is 7.87 W/(m·K) whereas that of Pb is 35.3 W/(m·K). However, practically, no problems are in this, since the bonding material is originally thin.

Incidentally, when a metallization of a surface of Si which is Ag, and a Cu plate (surface thereof is Ag) having a thickness of 2 mm are bonded by a bonding member of Bi alone and when the diameter of Si is 6 mm and the thickness of the Bi bonding member is 0.3-1 mm, tensile strength is about 320 N. When the stress relaxation member is inserted between Si and Cu in order to reduce stress, tensile strength of 750 N or more can be obtained. Moreover, when the above Bi is employed as the bonding material and the stress relaxation member is inserted, strength of 85% or more of original tensile strength can be obtained even after thermal cycle testing (−40-200° C., 400 cycles) is carried out.

When Bi alone is not employed as the bonding material and a bonding material of a Bi—Ag system in which Ag is added to Bi is employed as the bonding material and upper temperature at the time of bonding is 600° C. as described above, it is necessary to cause Ag content to be set to 60 wt % or less. When Ag content is set to 60 wt % or less, a solder structure is brought to a state where Ag is dispersed in Bi, so that bonding strength is approximately equal to bonding strength, that is provided in a case where Bi alone is employed as the bonding material. This is similar to a case where Bi alone or bonding material of a Bi—Ag system is employed as the bonding material for bonding Si and the member Standing on the foregoing, examples in which the above-mentioned bonding material of a Bi-system is applied to a high-voltage semiconductor device will be discussed hereinafter.

WORKING EXAMPLE 1

Some embodiments of a working example 1 in which the present invention is applied to a high-voltage semiconductor device used in an alternating-current generator for a vehicle and a Bi bonding material containing Bi alone or 60 wt % or more Ag (hereinafter referred to as "Bi-system bonding material") will be discussed hereinafter with reference to the accompanying drawings.

Figure 1:
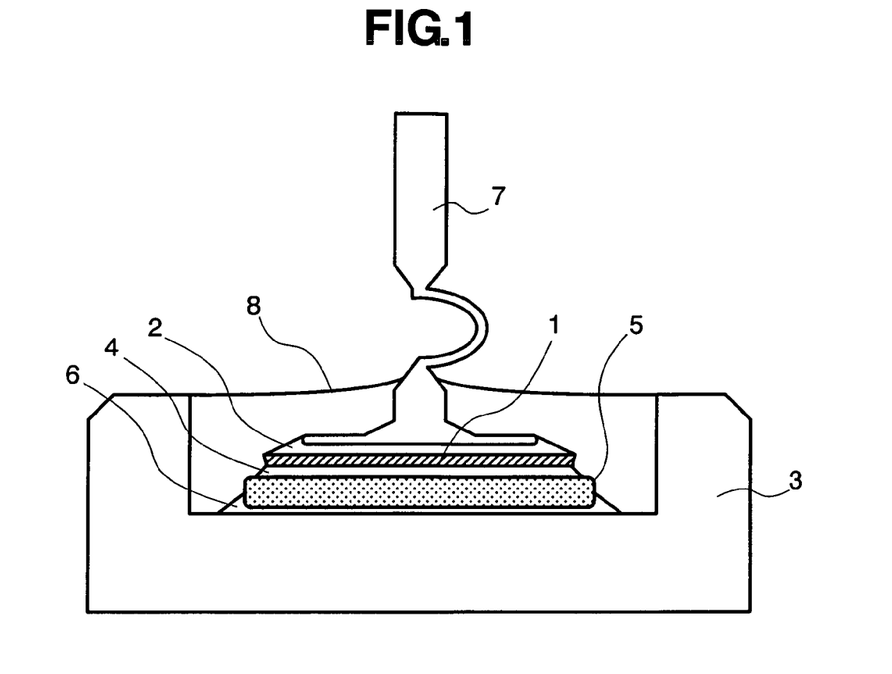
FIG. 1 is a schematic sectional view of a semiconductor device according to a first embodiment of a working example 1 of the present invention.

Referring to FIG. 1, there is illustrated a first embodiment of the working example 1 of a semiconductor device according to the present invention, which comprises a semiconductor element 1, a mounting electrode member 3 supporting the semiconductor element 1 through a stress relaxation member 5, a lead electrode 7 electrically connected to the semiconductor element, bonding members 2, 4, 6 bonding the lead electrode, the semiconductor element, and the stress relaxation member, respectively, the bonding members being formed of a Bi-system material, and a sealing material 8 filled within an inside of the mounting electrode member 3. In the first embodiment, the Bi-system bonding members 2, 4 come into contact with surfaces of the semiconductor element 1 and are bonded to the surfaces of the semiconductor element 1, between which other layers are not present. Thus, the semiconductor which is superior in heat-resistance, resistance to thermal stress and heat-radiativity can be provided. In the illustrated example, the semiconductor element 1 is a rectifying element such as, e.g., a Zener diode. When the semiconductor element 1 is formed into a disk-shape by, for example, bonding a plurality of semiconductor layers and electrode layers in a thickness direction, bonding portions of the stress relaxation member 5 and lead electrode 7 are formed into a disk-shape, the bonding members 2, 4, 6 are provided as circular-shaped solder foils or disk-shaped solder pellets, and a connection, portion of the bonding, member 6, a connection portion of the stress relaxation member 5, a connection portion of the bonding member 4, a connection portion of the semiconductor element 1, and a connection portion of the lead electrode 7 are in order laminated on a bottom surface of the cylindrical-shaped mounting electrode member 3, whereby the semiconductor device of, FIG. 1 are assembled.

In this embodiment, both surfaces of the semiconductor element land stress relaxation member 5, and connection surfaces of the mounting electrode member 3 and lead electrode 7 have thick silver (Ag) films previously formed thereon by plating in order to improve wettability of the bonding members, and are connected to one another by the bonding members 2, 4, 6. However, in a condition shown in FIG. 1 and after the connection is carried out, Ag is diffused into the bonding members 2, 4, 6 and the Ag films vanish.

Incidentally, the bonding members 2, 4, 6 are not all required to be Bi-system bonding material having the same composition, and Bi-system bonding members including layers having different compositions maybe employed from the viewpoint of temperature hierarchy and stress hierarchy which will be discussed in greater herein after. Moreover, taking improvement in heat-radiativity of the entire semiconductor device into account, it is preferable that films having thicknesses of 0.1-0.3 mm or so are provided. As the stress relaxation member 5, there may be employed a three-layer structure member in which an invar or 42 alloy is interposed by Cu. Furthermore, in the example shown in FIG. 1, while the number of the stress relaxation member is one, several layers of the stress relaxation members may be provided in order further relax stress. As the mounting electrode member 3 and the lead electrode 7, there maybe employed Cu-members having high thermal conductivity. As the sealing material 8, there may be employed any suitable heat-resisting resin, silicone rubber or the like.

Figure 2:
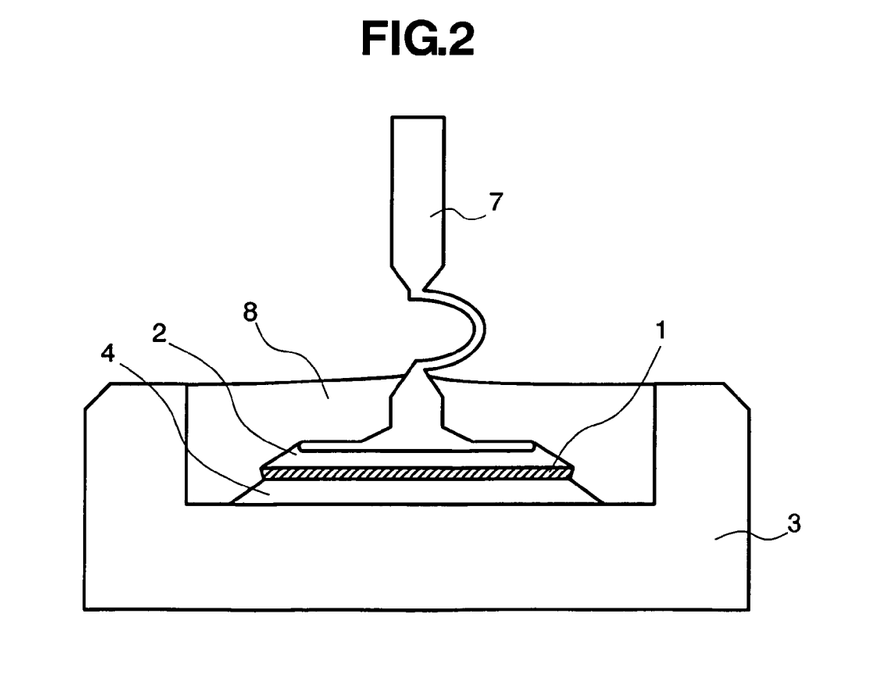
FIG. 2 is a schematic sectional view of a semiconductor device according to a second embodiment of the working example 1 of the present invention.

Referring to FIG. 2, a second embodiment of the working example 1 of the semiconductor device according to the present invention will be discussed hereinafter. The semiconductor device according to the second embodiment comprises the semiconductor element 1, the mounting, electrode member 3 supporting the semiconductor element 1, the lead electrode 7 electrically connected to the semiconductor element, the bonding members 2, 4 bonding the lead electrode and the semiconductor element, respectively, the bonding members being formed of Bi-system material, and the sealing material 8 filled within an inside of the mounting electrode member 4.

In the illustrated embodiment, the stress relaxation member 5 is not employed, so that the bonding member 4 bonding the semiconductor element 1 and the mounting electrode member 3 is preferably formed slightly thickly so as to have a thickness of 0.3-0.6 mm or so in order to resist stress.

Like the first embodiment, in the second embodiment, the both surfaces of the semiconductor element 1 and the connection surfaces of the mounting electrode member 3 and the lead electrode 7 have Ag-films previously formed thickly thereon by plating in order to facilitate improvement in wettability of the bonding members and are bonded. However, in a condition shown in FIG. 2 and after the connection is carried out, Ag is diffused into the bonding members 2, 4 and the Ag films vanish.

Figure 3:
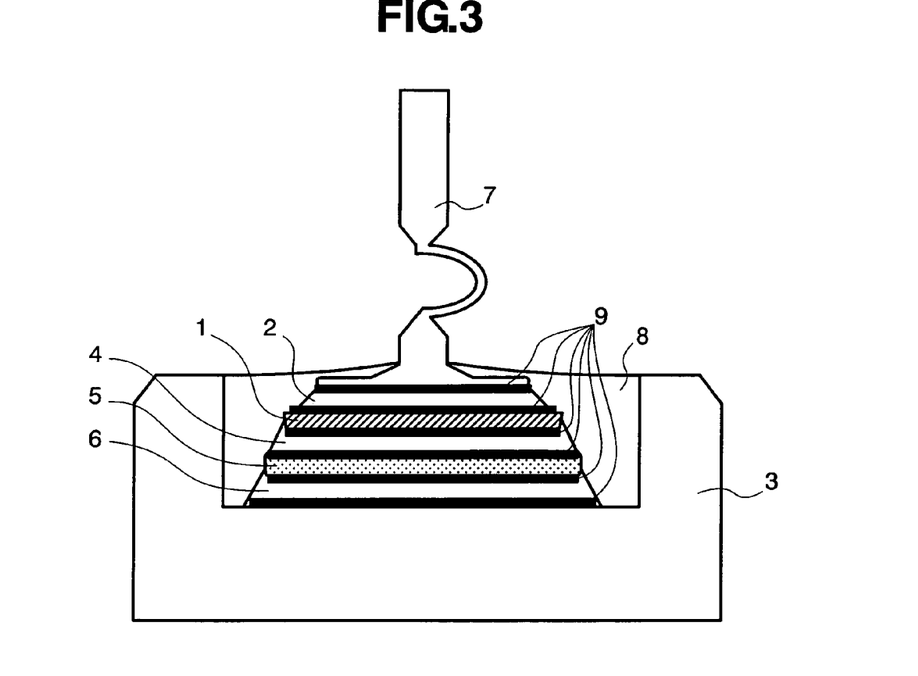
FIG. 3 is a schematic sectional view of a semiconductor device according to a third embodiment of the working example 1 of the present invention.

Referring to FIG. 3, a third embodiment of the working example 1 of the semiconductor device according to the present invention will be discussed hereinafter. The semiconductor device according to the third embodiment comprises the semiconductor element 1, the stress relaxation member 5, the mounting electrode member 3 supporting the semiconductor element 1 through the stress relaxation member 5, the lead electrode 7 electrically connected to the semiconductor element, the bonding members 2, 4, 6 bonding the lead electrode, the semiconductor element, and the stress relaxation member, respectively, the bonding members being formed of Bi-system material, Ag-layers 9 formed on interfaces thereof, and the sealing material 8 filled within an inside of the mounting electrode member 3. The difference between the third embodiment and the first embodiment is that the Ag-film of the first embodiment vanishes after the connection is carried out by the Bi-system bonding members 2, 4, 6 whereas the Ag-films still remain after the connection is carried out by the Bi-system bonding members 2, 4, 6. In a condition where the Ag-films are formed between the respective layers, the connection is carried out by the Bi-system bonding members 2, 4, 6, so that wettability is improved at the time of production and good connection can be obtained. For example, the Ag-layer comes into contact with a surface of the semiconductor element 1 and is bonded to the surface of the semiconductor element, and the Bi-system bonding members 2, 4 come into contact with the Ag-layers 9 and are bonded to the Ag-layers 9. Incidentally, while the semiconductor device shown in FIG. 3, has the Ag-layers 9 provided between the respective layers, it is not limited to such a structure and may be constructed in such a manner that the Ag-layer(s) 9 provided between arbitrary layers is (are) omitted.

Figure 4:
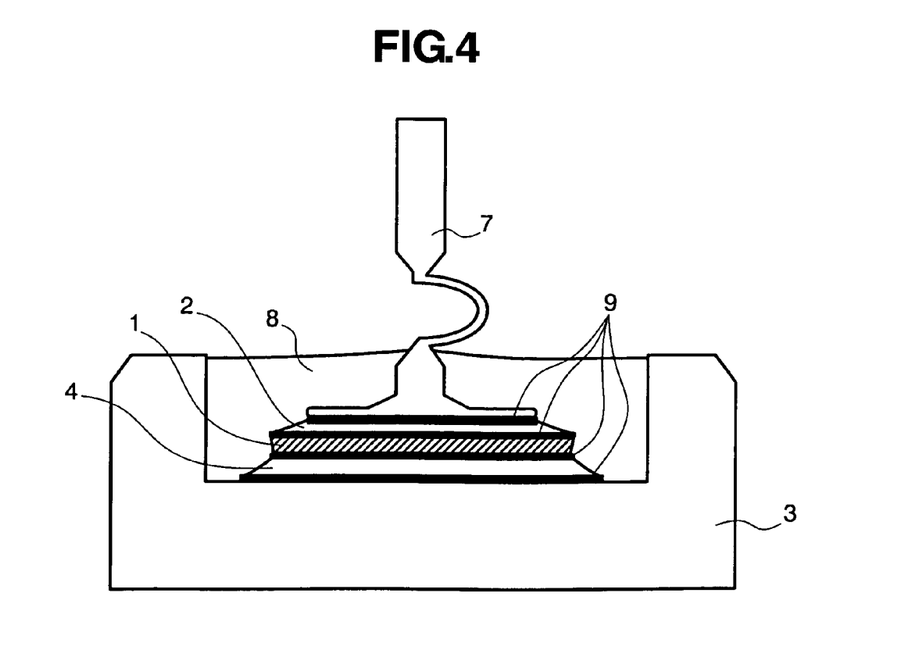
FIG. 4 is a schematic sectional view of a semiconductor device according to a fourth embodiment of the working example 1 of the present invention.

Referring to FIG. 4, a fourth embodiment of the working example 1 of the semiconductor device according to the present invention will be discussed hereinafter. The semiconductor of the fourth embodiment comprises the semiconductor element 1, the mounting electrode member 3 supporting the semiconductor element 1, the lead electrode 7 electrically connected to the semiconductor element, the bonding members 2, 4 bonding the lead electrode 7 and the semiconductor element, respectively, the bonding members being formed of Bi-system material, the Ag-layers 9 provided on interfaces thereof, and the sealing material 8 filled within an inside of the mounting electrode member 3. This embodiment is substantially similar to the third embodiment except that the stress relaxation member 5 is not employed. Therefore, in order to resist stress, the bonding member 4 bonding the semiconductor element 1 and the mounting electrode member 3 is preferably formed slightly thickly so as to have a thickness of 0.3-0.6 mm or so. Incidentally, like the third embodiment, the fourth embodiment may be constructed in such a manner that the Ag-layer(s) 9 provided between arbitrary layers is (are) omitted.

Figure 5:
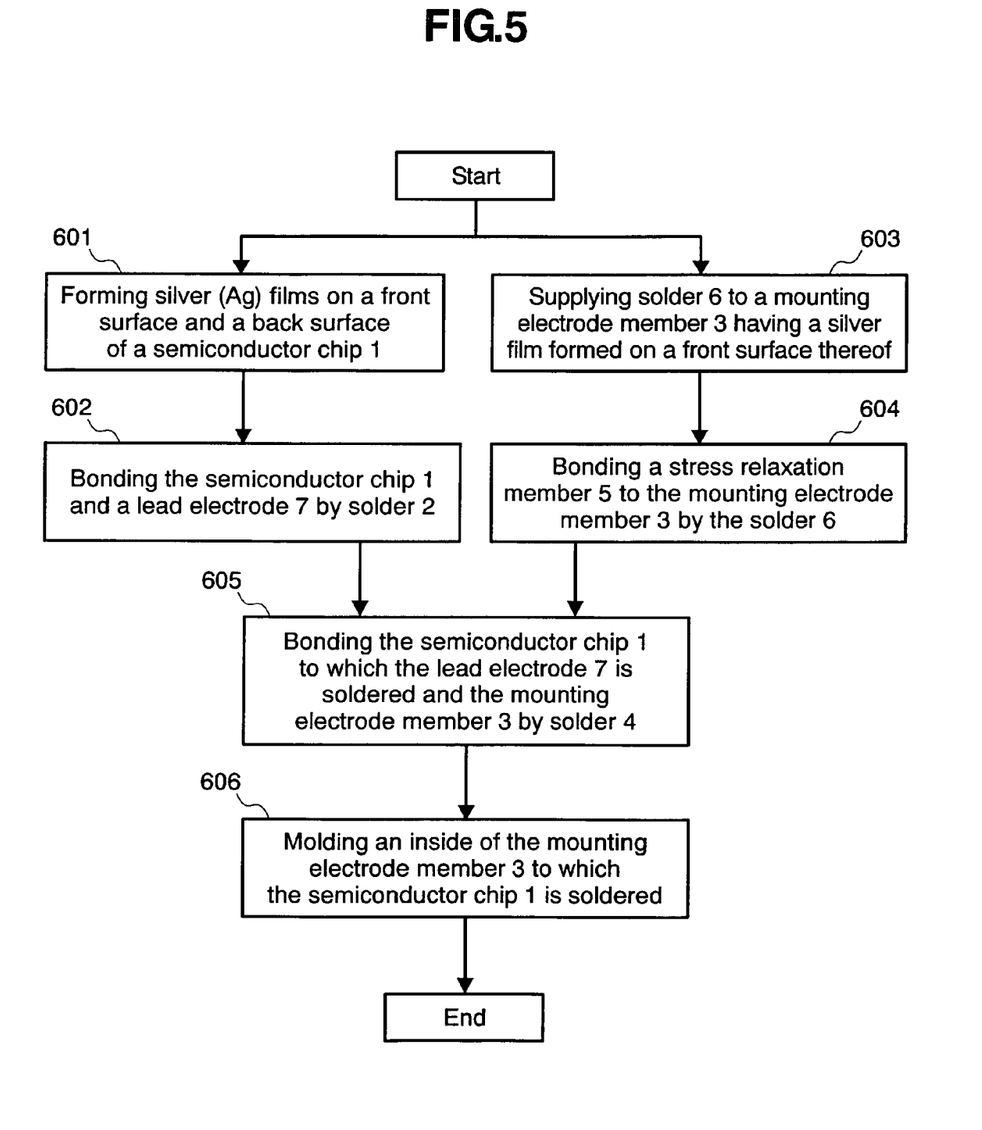
FIG. 5 is a flow chart exhibiting a first manufacturing method for manufacturing the semiconductor device of the working example 1 of the present invention.

Referring now to FIG. 5, a first manufacturing method for manufacturing the semiconductor device according to the working example in which the semiconductor device of FIG. 1 is employed as one example will be discussed hereinafter.

After the Ag-films 9 are first formed oh front and back surfaces of the semiconductor element 1 (step 601), one of the surfaces of the semiconductor element 1 and the lead-electrode 7 are bonded to each other by the bonding member 2 formed of Bi alone, in reducing atmosphere (step 602). At this time, the Ag-films 9 may be formed by plating and is preferably formed so as to have thicknesses of 5 μm or less. Therefore, as shown in FIG. 1, the Bi-layer can be formed directly over the semiconductor element 1 and good connection can be obtained. Incidentally, when semiconductor device of FIG. 3 in which the Ag-layers remain is manufactured, bonding atmosphere and temperature should be controlled so as not to be limited by the thicknesses of the Ag-layers.

On the other hand, the Bi-system bonding member 6 is supplied to the mounting electrode member 3 having the Ag film formed on the front surface thereof, and the mounting electrode member 3 and the stress relaxation member 5 are bonded to each other by the Bi-system bonding member 6 through reflow thereof (step 604). Thereafter, a connection structure assembly comprising the semiconductor element 1 and the lead electrode 7 which are bonded to each other, and a connection structure assembly comprising the mounting electrode member 3 and the stress relaxation member 5 which are bonded to each other, are boned to each other by the Bi-system bonding member 4 (step 605), and an inside of the mounting electrode member 3 to which the semiconductor element 1 is bonded is molded by heat-resisting resin, silicone rubber or the like, whereby a finished product is manufacture (step 606). Incidentally, as the form of the Bi-system bonding member to be supplied, there may be employed a plate-form, a foil-form, plating, deposition, paste or the like. Its form should be selected if need.

In this manufacturing method, there is a possibility that at the time of bonding by the Bi-system bonding member 4, the Bi-system bonding members 2, 6 which are already bonded will be re-melted. Therefore, the Bi-system bonding members 2, 6 should be formed of Bi bonding material comprising composition having a melting point higher than that of the composition of the Bi-system-bonding member 4 and temperature hierarchy should be formed. Specifically, for example, the Bi-system bonding members 2, 6 are formed of Bi20Ag bonding material (melting point of 380° C.) and the Bi-system bonding member 4 is formed of Bi10Ag bonding material (melting point of 340° C.).

Figure 6:
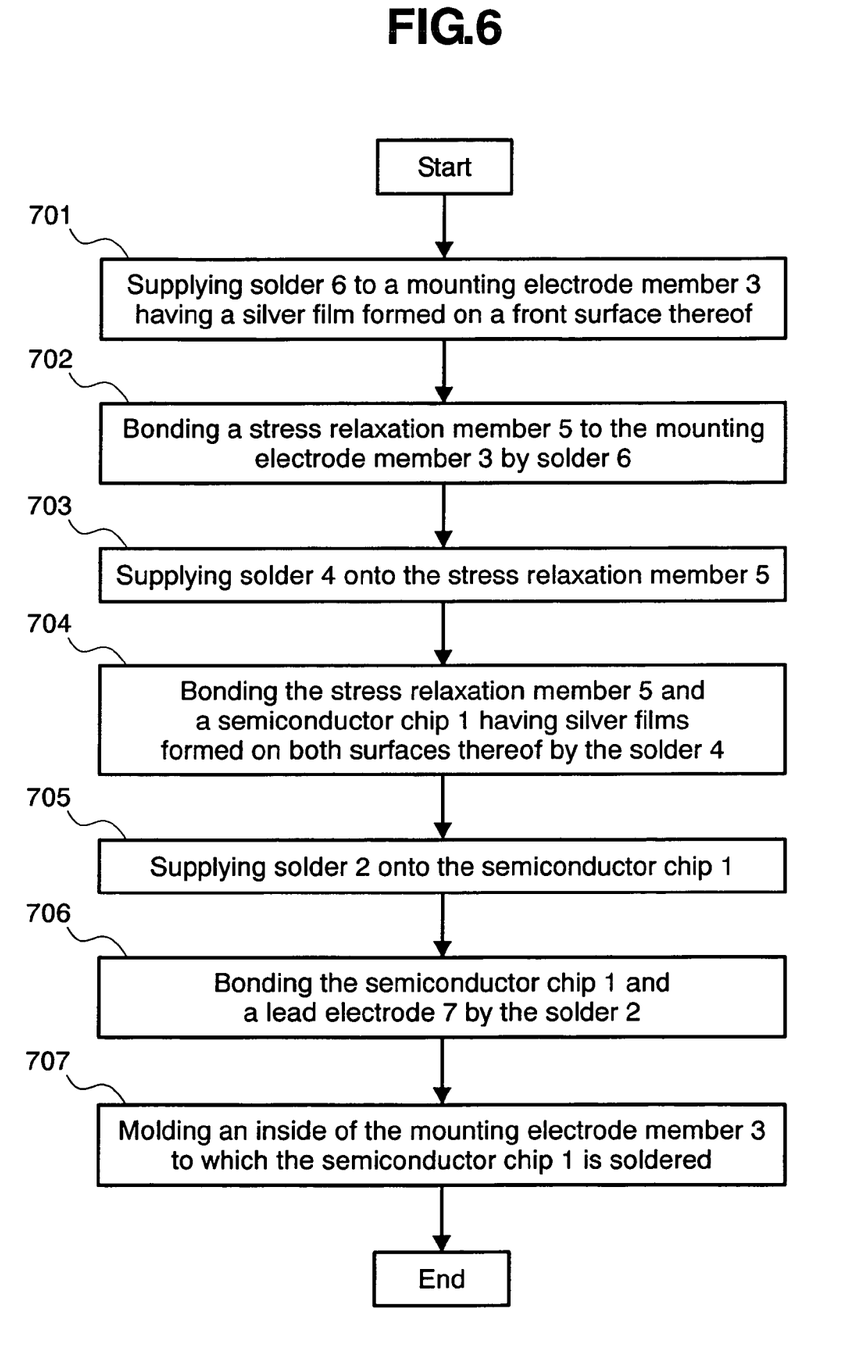
FIG. 6 is a flow chart exhibiting a second manufacturing method for manufacturing the semiconductor device of the working example 1 of the present invention.

Referring to FIG. 6, a second manufacturing method for manufacturing the semiconductor device according to the present invention will be discussed hereinafter. The Bi-system bonding member 6 is first supplied to the mounting electrode member 3 having the Ag film formed on the front surface thereof (step 701), and the stress relaxation member 5 is bonded to the mounting electrode member 3 by the Bi-system bonding member 6 in reducing atmosphere (step 702). Then, the Bi-system bonding member 4 is supplied onto the stress relaxation member 5 (step 703), and the semiconductor element 1 having Ag films formed on both surfaces thereof and the stress relaxation member 5 are bonded to each other by the Bi-system bonding member 4 (step 704). The Bi-system bonding member 2 is then supplied onto the semiconductor element 1 (step 705), and the semiconductor element 1 and the lead electrode 7 having the Ag film formed on a front surface thereof are bonded to each other by the Bi-system bonding member 2 (step 706). Finally, the inside of the mounting electrode member to which the semiconductor element 1 is bonded is molded, whereby a finished product is manufactured (step 707).

In this manufacturing method, the Bi-system bonding members 6, 4, 2 are bonded in order, so that it is necessary to form three temperature hierarchies. For example, when the bonding is carried out in order described above, the bonding member 6 should be made of Bi30Ag bonding material (a melting point of 420° C.), the bonding member 4 should be made of Bi20Ag bonding material, and the bonding member 2 should be made of Bi10Ag bonding material.

Figure 7:
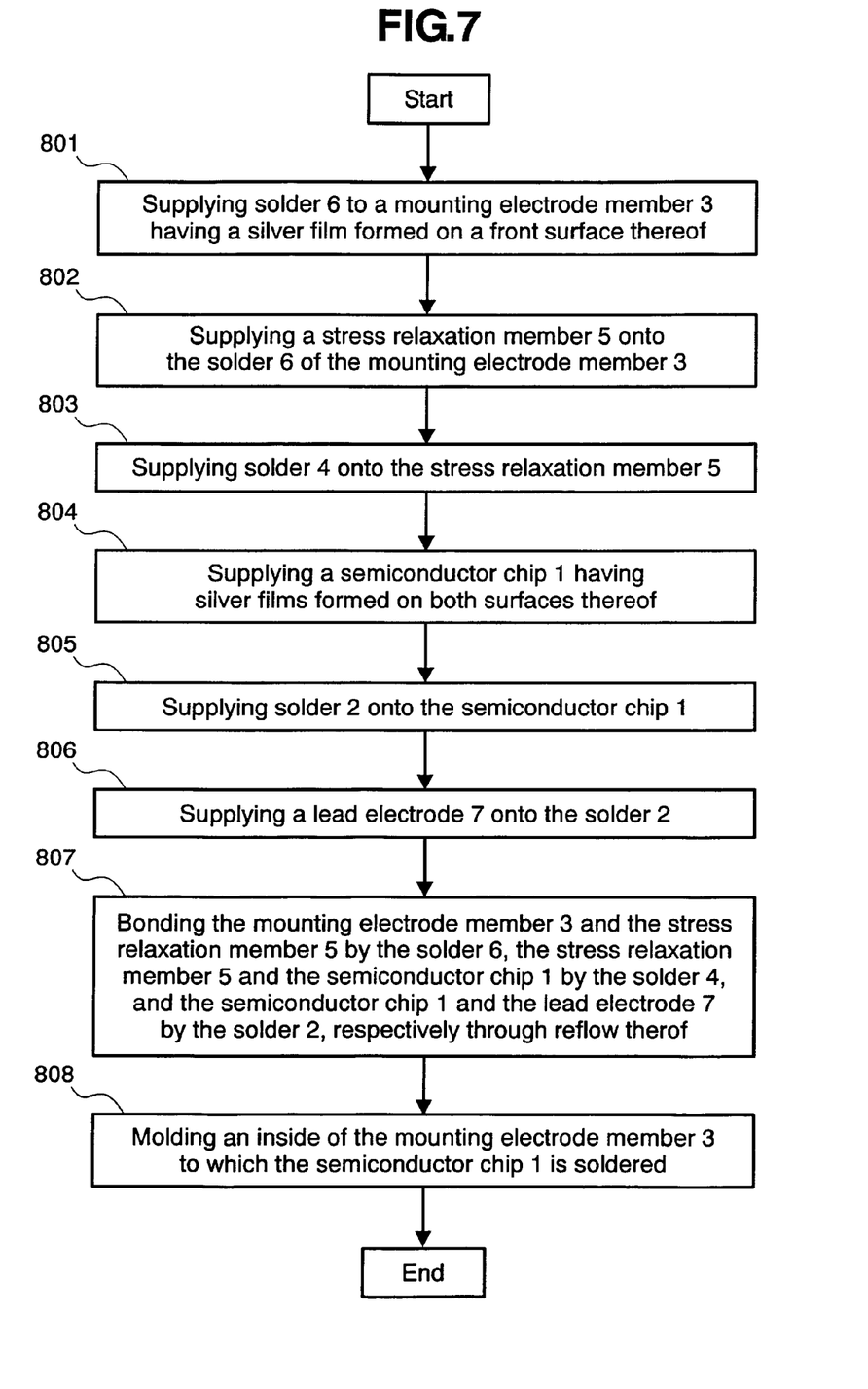
FIG. 7 is a flow chart exhibiting a third manufacturing method for manufacturing the semiconductor device of the working example 1 of the present invention.

Referring to FIG. 7, a third manufacturing method for manufacturing the semiconductor device of the working example will be discussed hereinafter. The Bi-system bonding member 6 is first supplied to the mounting electrode member 3 plated on its front surface with Ag (step 801), the stress relaxation member 5 is supplied onto the Bi-system bonding member 6 (step 802), and the bi-system bonding member 4 is supplied onto the stress relaxation member 5 (step 803). Moreover, the semiconductor element L having the A4 films formed on both surfaces thereof is supplied onto the Bi-system bonding member 4 (step 804), the Bi-system bonding member 2 is supplied onto the semiconductor element 1 (step 805), and the lead electrode 7 is supplied onto the. Bi-system-bonding member 2 (step 806). Then, the mounting electrode member 3 and the stress relaxation member 5 are bonded to each other by the Bi-system bonding member 6 through reflow thereof, the stress relaxation member 5 and the semiconductor element 1 are bonded to each other by the Bi-system bonding member 4 through reflow thereof, and the semiconductor element and the lead electrode 7 are bonded to each other by the Bi-system bonding member 2, whereby they are bonded in a time (step 807). Finally, the inside of the mounting electrode member 3 to which the semiconductor element 1 is bonded is molded, whereby a finished product is manufactured (step 808).

In this manufacturing method, the Bi-system bonding members 2, 4, 6 are bonded at a time, so that they may be all formed of material having the same composition and temperature hierarchy may not be formed as in the first and second manufacturing methods. Therefore, in this manufacturing method, from the view point of softness of the respective compositions of the Bi-system bonding members, their thermal resistivity, thermal conductivity or the like, an optimum combination of temperature hierarchies may be formed.

While some manufacturing methods for manufacturing the semiconductor of the working example are discussed above, the present invention is limited to the examples, the order of bonding may be changed, and any optimum materials may be selected in connection with the change of the bonding order.

Incidentally, while the Zener diode is employed as the semiconductor element 1 in the above-mentioned working example, the semiconductor element 1 may be a rectifying element or thyristor element for high-power.

WORKING EXAMPLE 2

As a working example 2, a case where the present invention is applied to an IGBT module which is assembled using an IGBT (Insulated Gate Bipolar Transistor: bipolar transistor having an insulated gate) element will be discussed hereinafter.

Figure 8:
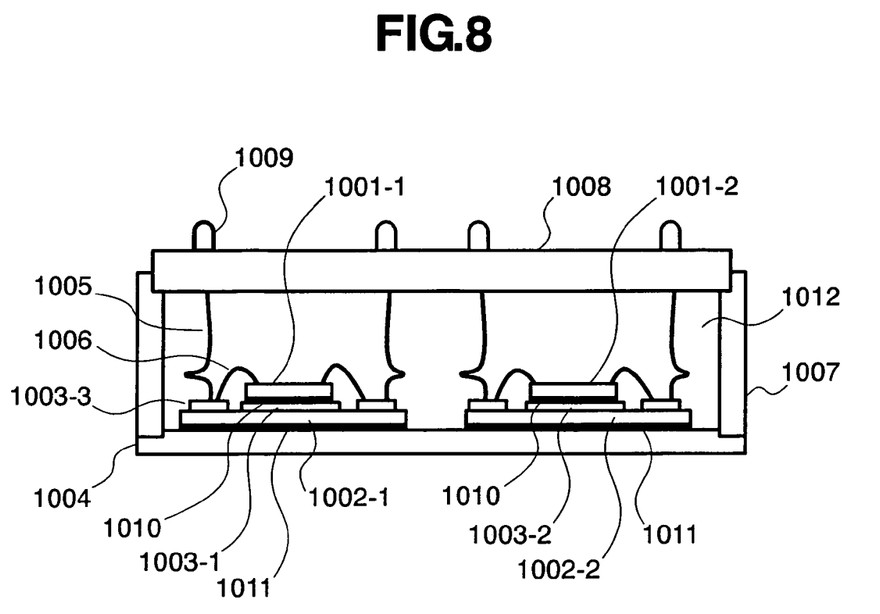
FIG. 8 is a schematic sectional view of an IGBT module according to a working example 2 of the present invention.

FIG. 8 shows a structure of a part of the IGBT module assembled using the IGBT element. In this Figure, reference numerals 1001-1, 1001-2 denote the IGBT elements, reference numeral 1002 designates an insulated substrate, reference numerals 1003-1, 1003-2 denote copper wiring patterns, reference numeral 1004 designates a copper plate, reference numeral 1005 denotes an aluminum wire, reference numeral 1006 denotes an internal wiring, reference numeral 1007 designates a case, reference numeral 1008 denotes a lid, and reference numeral 1009 denotes a terminal. The IGBT element 1001-1 and the copper wiring patterns 1003-1, 1003-2 are connected to one another by Bi-system bonding members 1010, and the insulated substrate 1002 and the copper plate 1004 are connected to each other by a Bi-system bonding material 1011. As the Bi-system bonding members 1010 and 1011, bonding members which are similar to those described in the working example 1, namely, Bi alone, Bi—Ag system bonding members or ternary or more bonding members in which in addition to the Bi—Ag system bonding members, other metallic elements are added, are employed. Moreover, any sealing material 1012 such as silicone gel is filled within an inside of the case 1007.

In this working example, surfaces of the IGBT elements 1001-1, 1001-2 and surface of the copper wiring patterns 1003-1, 1003-2 which are bonded to one another by the Bi-system bonding members-1010 also have Ag films previously formed so as to have thickness of 10 μm or less, and preferably 5 μm or less. They are bonded at the Ag film-formed surfaces thereof by the Bi-system bonding members 1010. In this working example, Ag is gradually diffused with an inclination of its density or concentration in the Bi-system bonding member layers in interfaces between the Bi-system bonding members 1010, and the IGBT elements 1001-1, 1001-2 and the wiring patterns, and is bonded in such a manner that Ag is gradually diffused with an inclination of its density.

Moreover, a surface of the insulated substrate 1002 and a surface of the copper plate 1004 which are bonded by the Bi-system bonding members 1011 are formed with Ag films having thickness, of 10 μm or less and preferably 5 μm or less. The insulated substrate and the copper plate are boned to each other at the Ag film-formed surfaces by the Bi-system bonding members 1011. In this case, in the same manner as described above, Ag is gradually diffused with an inclination of its density or concentration in the Bi-system bonding member layers in interfaces between the Bi-system bonding members 1010, and the insulated substrate 1002 and the copper plate 1004, and bonded. Thus, the IGBT module which is superior in heat-resistivity, resistance to thermal stress, and heat-radiativity can be provided.

When bonding of the insulated substrate 1002 onto the copper 1004 and bonding of the wiring patterns 1003-1, 1003-2, the IGBT elements 1001-1, 1001-2 onto the insulated substrate 1002 are carried out separately from one another, the Bi-system bonding member 1010 and the Bi-system bonding member 1011 should be formed of material having compositions varied in ratio and melting points. For example, when the Bi-system bonding member 1010 and the Bi-system bonding member 1011 are combined with each other, the Bi-system bonding member 1010 is formed of Bi30Ag and the Bi-system bonding member 1011 is formed of Bi20Ag or Bi10Ag. Also, when the Bi-system bonding member 1010 is formed of Bi20Ag, the Bi-system bonding member 1011 is formed of Bi10Ag.

On the other hand, when bonding of the insulated substrate 1002 onto the copper plate 1004 and bonding of the wiring patterns 1003-1, 1003-2 and the IGBT elements 1001-1, 1001-2 onto the insulated substrate 1002 are carried out at a time, the Bi-system bonding member 1010 and the Bi-system bonding member 1011 may be formed of material having the same composition.

WORKING EXAMPLE 3

Figure 9:
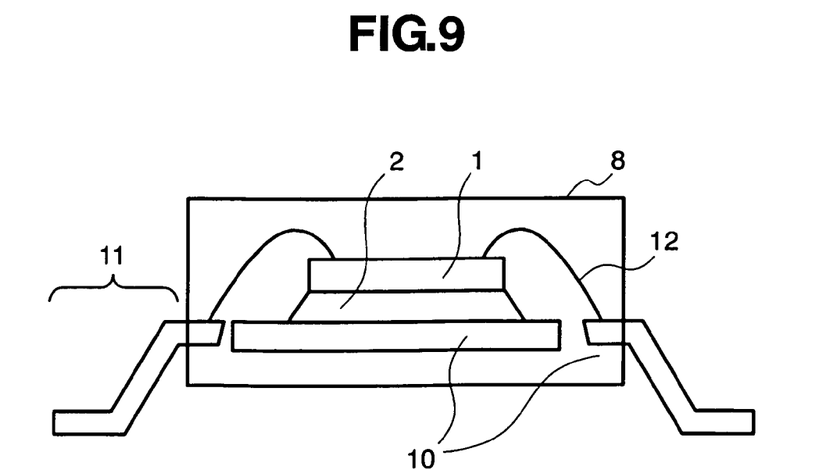
FIG. 9 is a schematic sectional view of a semiconductor device according to a working example 3 of the present invention.

Referring to FIG. 9, a semiconductor device according to a working example 3 of the present invention will be discussed hereinafter. The semiconductor device of the working example 3 comprises a semiconductor element 1 having a circuit formed on a front surface thereof, a Cu-system lead frame 10 supporting the semiconductor element 1, a wire 12 electrically connected a lead portion 11 of the Cu-system lead frame 10 and the semiconductor element 1, and a sealing member 8 sealing at least the semiconductor element 1. In this working example, Ag films having thicknesses of 10 μm or less and preferably 5 μm or less are formed on a back surface of the semiconductor element 1 and the Cu-system lead frame 10. In this condition, the semiconductor element 1 and the Cu-system lead frame are bonded to each other by a Bi-system bonding member 2. Also, in the same manner as described in the working examples 1, 2, the gradually-diffused layer of Ag is formed in an interface between the Bi-system bonding member layer of the back surface of the semiconductor element 1 and the Bi-system-bonding member layer of the Cu-system lead frame 10 and bonded. Thus, the semiconductor device which is superior in heat-resistivity, resistance to thermal stress, and heat-radiativity can be provided. As the sealing member 8, there may be employed heat-resisting resin, silicone rubber or the like.

While the present invention made by the inventors is described above with reference to the working examples, the present invention is not limited to such working examples, and various modifications may be made in the working examples without departing from the scope of the invention.

Moreover, while the semiconductor device is described above per working example and the manufacturing method therefor, the present invention is not limited such working examples and may be applied to any other suitable working examples.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A semiconductor device having a structure in which a semiconductor element and a copper member are bonded, wherein said semiconductor element and said copper member are bonded by a first bonding member which has a melting point of 260° C. or more and is bismuth (Bi)-based, and metal formed on a surface of said semiconductor element is gradually diffused in a region of said bonding member near an interface thereof connected to said semiconductor element.

2. A semiconductor device according to claim 1, wherein metals are formed on a front surface of said semiconductor element and said copper member, and each of said metals is at least one of metals selected from the group consisting of silver (Ag), gold (Au), Nickel (Ni), copper (Cu) and zinc (Zn).

3. A semiconductor device according to claim 1, wherein said copper member is bonded to a mounting member by a second bonding member which is bismuth (Bi)-based.

4. A semiconductor device according to claim 3, wherein said copper member is a member which constitutes a material buffering thermal expansion coefficient difference between said semiconductor element and said mounting member.

5. A semiconductor device according to claim 3, wherein said first and second bonding members which are bismuth (Bi) based contain not more than 60 weight % silver (Ag).

6. A semiconductor device according to claim 3, wherein said first and second bonding members which are bismuth (Bi) based are different in melting points thereof.

7. A semiconductor device having a structure in which a semiconductor element is metallically bonded to a member, wherein
said semiconductor element and said member are bonded by a first bonding member which is bismuth (Bi)-based and contains 60 weight % or less silver (Ag), and
said first bonding member has a diffusion layer in which metal formed on a surface of said semiconductor element is gradually diffused in a region thereof near an interface thereof connected to said semiconductor element.

8. A semiconductor device according to claim 7, wherein said diffusion layer is formed by diffusion of said metal formed on said surface of said semiconductor element into said first bonding member.

9. A semiconductor device according to claim 7, wherein metals are formed on a front surface of said semiconductor element and said copper member, and
each of said metals is at least one-metal selected from the group consisting of silver (Ag), gold (Au), Nickel (Ni), copper (Cu) and zinc (Zn).

10. A semiconductor device according to claim 7, wherein said member is metallically bonded to a mounting member by a second bonding member which is bismuth (Bi)-based and contains 60 weight % or less silver (Ag), and
said first and-second-bonding member are different in melting points thereof.

11. A semiconductor device according to claim 7, wherein said semiconductor device is a rectifying element or an IGBT element.

12. A semiconductor device having a structure in which one of surfaces of a semiconductor element is bonded to a first member by a first bonding member, and another of said surfaces is bonded to a second member by a second bonding member, wherein
said first and second bonding members are bismuth (Bi)-based or metals bismuth-based and containing silver (Ag), and
diffusion layers of metals respectively formed on said surfaces of said semiconductor elements are formed in regions of said first and second bonding members near interfaces thereof connected to said semiconductor element.

13. A semiconductor device according to claim 12, wherein each of said metals in said diffusion layers is gradually diffused with an inclination of density or concentration thereof in each of the regions of said first and second bonding members near the interfaces thereof connected to said semiconductor element.

14. A semiconductor device having a structure in which a semiconductor element has metallic layers formed on both surfaces thereof, a copper (Cu) member is bonded to one of said surfaces of said semiconductor element by a first bonding member, and a lead electrode is bonded to another of said surfaces of said semiconductor element by a second bonding member, wherein
said first and second bonding members are metals which are bismuth (Bi)-based, contain silver (Ag) and are different from each other in Ag content, and
said second bonding member has a melting point higher than that of said first bonding member.

15. A semiconductor device according to claim 14, wherein metals of said metallic layers formed on said surfaces of said semiconductor element are diffused in regions of said first and second bonding members near interfaces thereof connected to said semiconductor element.

16. A semiconductor device according to claim 14, wherein said semiconductor element is a rectifying element.

17. A semiconductor device comprising:
a semiconductor element having a main surface;
a conductive member having a main surface;
a bonding layer bonding said main surface of said semiconductor element to said main surface of said conductive member, said bonding layer being formed of a bismuth-silver-system alloy;
said bonding layer including a first region having a first bismuth-silver composition, and a second region having a second bismuth-silver composition;
said first bismuth-silver composition being higher in silver content than that of said second bismuth-silver composition;
said first region coming into contact with said main surface of said semiconductor element and said main surface of said conductive-member; and
silver content in said bismuth-silver-system alloy forming said bonding layer including said first and second regions being within the range of 15 weight % to 60 weight %.

18. A semiconductor device according to claim 17, wherein said silver content in said bismuth-silver-system alloy forming said bonding layer is 60 weight % or less.

19. A semiconductor device according to claim 17, wherein a metallic film is formed on at least one of said main surfaces of said semiconductor element and said conductive member, wherein
atoms forming said metallic layer are diffused in said bonding layer, and wherein concentration of said atoms in said bonding layer is reduced from said main surface on which said metallic layer is formed, toward a thickness direction of said bonding layer.

20. A semiconductor device according to claim 19, wherein said atoms forming said metallic film in said bonding layer are diffused to a depth of ½ or more of a thickness of said bonding layer from said one of said main surfaces of said semiconductor element and said conductive member on which said metallic film is formed.

* * * * *